United States Patent
Lu et al.

(10) Patent No.: US 11,211,434 B2
(45) Date of Patent: Dec. 28, 2021

(54) ORGANIC LIGHT EMITTING DIODE DISPLAY PANEL AND MANUFACTURING METHOD THEREOF, AND DISPLAY DEVICE

(71) Applicant: Wuhan China Star Optoelectronics Semiconductor Display Technology Co., Ltd., Hubei (CN)

(72) Inventors: Rui Lu, Hubei (CN); Zijun Yan, Hubei (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 109 days.

(21) Appl. No.: 16/621,988

(22) PCT Filed: Oct. 18, 2019

(86) PCT No.: PCT/CN2019/111991
§ 371 (c)(1),
(2) Date: Dec. 12, 2019

(87) PCT Pub. No.: WO2021/017196
PCT Pub. Date: Feb. 4, 2021

(65) Prior Publication Data
US 2021/0036072 A1 Feb. 4, 2021

(30) Foreign Application Priority Data
Jul. 31, 2019 (CN) .......................... 201910699044.0

(51) Int. Cl.
*H01L 51/52* (2006.01)
*H01L 27/32* (2006.01)
*H01L 51/56* (2006.01)

(52) U.S. Cl.
CPC ...... *H01L 27/3244* (2013.01); *H01L 51/5253* (2013.01); *H01L 51/56* (2013.01); *H01L 2227/323* (2013.01)

(58) Field of Classification Search
CPC .......... H01L 2227/323; H01L 27/3244; H01L 51/5253; H01L 51/5256; H01L 51/56
See application file for complete search history.

(56) References Cited

U.S. PATENT DOCUMENTS 10,361,394 B2 * 7/2019 Huang ................ H01L 51/0005
10,566,572 B2 * 2/2020 Oh ....................... H01L 27/3258
(Continued)

FOREIGN PATENT DOCUMENTS

CN 103996629 A 8/2014
CN 104349892 A 2/2015
(Continued)

*Primary Examiner* — Jaehwan Oh
(74) *Attorney, Agent, or Firm* — The Roy Gross Law Firm, LLC; Roy Gross

(57) ABSTRACT

The present disclosure discloses an organic light emitting diode display panel, a method of manufacturing an organic light emitting diode display panel, and a display device. By forming a film layer having super-hydrophobic properties of the outer water oxygen barrier layer of the thin film encapsulation layer, that is, constructing a rough surface, the surface of the hydrophobic film layer has an extremely thin air layer to reduce direct contact of moisture with the thin film encapsulation layer, thereby reducing the penetration of water and oxygen effectively, improving the water-blocking ability of the film encapsulation layer, and extending the lifetime of the display panel.

5 Claims, 5 Drawing Sheets

(56) References Cited

U.S. PATENT DOCUMENTS

| | | | |
|---|---|---|---|
| 2003/0170496 A1* | 9/2003 | Hieda | H01L 51/5259 428/690 |
| 2003/0222267 A1 | 12/2003 | Kim | |
| 2011/0305874 A1* | 12/2011 | Thoumazet | C04B 41/009 428/172 |
| 2015/0125659 A1 | 5/2015 | Fujiyama et al. | |
| 2015/0380683 A1* | 12/2015 | You | H01L 51/56 257/40 |
| 2016/0104867 A1* | 4/2016 | Lee | H01L 51/5234 257/40 |
| 2016/0254481 A1* | 9/2016 | Zeng | H01L 51/0094 257/40 |
| 2019/0136073 A1* | 5/2019 | Bake | C07F 7/14 |
| 2020/0083484 A1* | 3/2020 | Lee | H01L 51/5256 |

FOREIGN PATENT DOCUMENTS

| | | |
|---|---|---|
| CN | 204696131 U | 10/2015 |
| CN | 109509766 A | 3/2019 |

\* cited by examiner

ORGANIC LIGHT EMITTING DIODE DISPLAY PANEL AND MANUFACTURING METHOD THEREOF, AND DISPLAY DEVICE

FIELD OF INVENTION

The present disclosure relates to the field of display technologies, and more particularly to an organic light emitting diode display panel and manufacturing method thereof, and a display device.

BACKGROUND OF INVENTION

With the development of display technology, flexible display devices have wider applications due to their advantages of being light weight, thin thickness, flexibility, and wide viewing angle range. However, organic light emitting diode (OLED) materials are very sensitive to water and oxygen, and a small amount intrusion of water and oxygen will cause rapid decay of the device, affecting lifetime of the OLED. In order to ensure the lifetime of the flexible display device, the packaging technology is particularly important.

In order to implement the flexible display of the OLED, the OLED protection is generally implemented using thin-film encapsulation (TFE). Current thin film encapsulation process is briefly as follows: (1) depositing a first inorganic layer as a water and oxygen barrier layer on a substrate on which an OLED is deposited, the first inorganic layer may be a silicide or a metal oxide, etc.; (2) after depositing the first inorganic layer, an organic layer is deposited to buffer and cover the foreign matter generated during the first inorganic layer formation process, extending the water and oxygen transmission channel, where the organic layer can be an IJP film layer, etc.; (3) continue depositing a second layer of the organic layer, the second layer of the organic layer can serve as a water oxygen barrier layer, which may include a silicide, a metal oxide or, the like.

The current TFE structure can effectively isolate water and oxygen in a certain degree to ensure the lifetime of the OLED. However, with the development of display technology, the thinning of display devices has become a trend, and therefore there are greater requirements on packaging processes.

In order to achieve ultra-thinning of OLED devices, it is required to develop an ultra-thin TFE structure. However, the thinner the TFE structure, the greater the possibility of package failure under the same conditions, so it is required to develop an encapsulation layer with better water-blocking oxygen resistance.

There is a problem that the encapsulation layer ineffective in the prior art.

SUMMARY OF INVENTION

In order to solve the above problems, the present disclosure provides an organic light diode display panel, including a base substrate, a thin film transistor layer disposed on the base substrate, an organic light emitting layer disposed on the thin film transistor layer, a thin film encapsulation layer disposed on the organic light emitting layer, and a hydrophobic film layer disposed on the thin film encapsulation layer.

Furthermore, the hydrophobic film layer has a nano-scale microstructure.

Furthermore, a surface of the hydrophobic film layer has an uneven shape.

Furthermore, a contact angle of a surface of the hydrophobic film layer with an external liquid is greater than 150 degrees.

Furthermore, the thin film encapsulation layer, including: a first inorganic layer covering the thin film transistor layer, an organic layer disposed on the first inorganic layer, and a second inorganic layer covering the thin film transistor layer.

The present disclosure further provides a method of manufacturing an organic light emitting diode display panel, including: providing a base substrate, forming a thin film transistor layer on the base substrate, forming an organic light emitting layer on the thin film transistor layer, forming a thin film encapsulation layer on the organic light emitting layer; and forming a hydrophobic film layer on the thin film encapsulation layer.

Furthermore, the step of forming a thin film encapsulation layer on the organic light emitting layer further includes: forming a first inorganic layer on the organic light emitting layer; forming an organic layer on the first inorganic layer; and forming a second inorganic layer on the organic layer.

Furthermore, after the step of forming the second inorganic layer on the organic layer, the method further includes: processing a plasma treatment to the second inorganic layer, so as to cause a surface of the second inorganic layer to be an uneven shape, and further causing the second inorganic layer to become the hydrophobic film layer.

Furthermore, after the step of forming the second inorganic layer on the organic layer, the method further includes: forming a silicide layer on the second inorganic layer, and forming the hydrophobic film layer by processing a polycondensation reaction to the silicide layer.

Furthermore, material of the plasma includes an argon gas plasma or a nitrogen plasma.

The present disclosure provides a display device including the organic light emitting diode display panel described above.

An advantage of the present disclosure: forming a film layer having super-hydrophobic properties of the outer water oxygen barrier layer of the thin film encapsulation layer. Further, a surface of the thin film encapsulation layer has an uneven shape, the hydrophobic film layer has a nano-scale microstructure. A surface of the hydrophobic film layer is formed into a nanometer-scale ultra-thin air layer. When the external moisture contacts the hydrophobic film layer, the direct contact between the water and the hydrophobic film layer can be reduced due to the air layer interposed therebetween, thereby improving the water and oxygen barrier ability of the hydrophobic membrane layer. In addition, the hydrophobic film layer further has a hydrophobic group, so that the contact angle of a surface of the hydrophobic film layer 7 with the external liquid is greater than 150 degrees, thereby further improving the water-oxygen barrier property of the hydrophobic film layer, reducing the penetration of water and oxygen effectively, improving the water-blocking ability of the film encapsulation layer, and extending the lifetime of the display panel.

DESCRIPTION OF DRAWINGS

In order to more clearly illustrate the technical solutions in the embodiments or the prior art, the figures be used in the embodiments of present disclosure or the prior art description will be briefly described below. Obviously, the accompanying figures described below are only part of the embodiments of the present disclosure, from which figures those skilled in the art can derive further figures without any inventive steps.

DETAILED DESCRIPTION OF PREFERRED EMBODIMENTS

The technical solutions in the embodiments of the present disclosure are clearly and completely described below. It is obvious that the described embodiments are not all the embodiments of the present disclosure. All other embodiments obtained by those skill in the art without inventive steps are within the protective scope of the present disclosure.

In the description of the present disclosure, it is to be understood that the terms of orientation or positional relationship such as "center", "longitudinal", "transverse", "length", "width", "thickness", "upper", "lower", "front", "rear", "left", "right", "vertical", "horizontal", "top", "bottom", "inner", "out", "clockwise" or "counterclockwise" is based on the orientation or positional relationship shown in the figures, only for the convenience of describing the present disclosure and simplifying the description. Which is not intended to indicate or imply that the device or component referred to has a specific orientation, and is constructed and operated in a specific orientation. Therefore, it should not be construed as limiting the present disclosure.

In addition, the terms "first" and "second" are used for descriptive only, and are not to be construed as indicating or implying a relative importance or implicitly indicating the number of technical features, thereby defining features that are thus defined as "first", "second" may explicitly or implicitly include one or more of the features described. In the description of the present disclosure, the meaning of "plurality" is two or more, unless specifically defined.

Figure 1:
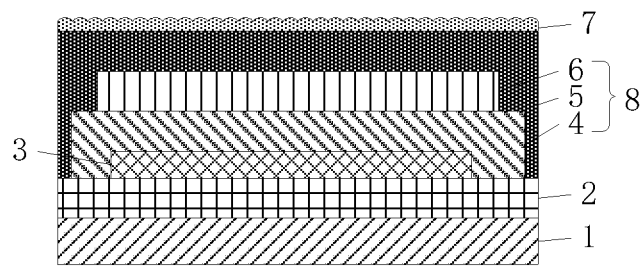
FIG. 1 is a schematic structural diagram of an organic light emitting diode display panel according to an embodiment of the present disclosure.

As shown in FIG. 1, a schematic structural diagram of an organic light emitting diode display panel according to an embodiment of the present disclosure includes: a base substrate 1, a thin film transistor layer 2, an organic light emitting layer 3, a thin film encapsulation layer 8, and a hydrophobic film layer 7.

In an embodiment of the present disclosure, the base substrate 1 may be a glass substrate, but is not limited thereto. For example, the base substrate 1 may also be a plastic substrate, or a base substrate made of PI material.

The thin film transistor layer 2 is disposed on the base substrate 1. The organic light emitting layer 3 is disposed on the thin film transistor layer 2. The thin film encapsulation layer 8 is disposed on the organic light emitting layer 3. The hydrophobic film layer 7 is disposed on the thin film encapsulation layer 8.

The thin film encapsulation layer 8 includes a first inorganic layer 4, an organic layer 6, and a second inorganic layer 5.

Further, the first inorganic layer 4 covering the thin film transistor layer 2, and the first inorganic layer 4 serves as a water oxygen barrier layer. Material of the first inorganic layer 4 may be a silicide, a metal oxide, or the like.

After forming the first inorganic layer 4, an organic layer 6 is deposited to buffer and cover the foreign matter generated during the first inorganic layer 4 formation process, extending the water oxygen transmission channel. The organic layer 6 is disposed on the first inorganic layer 4. For example, the organic layer 6 can be formed by inkjet printing.

The second inorganic layer 5 is continuously deposited on the organic layer 6 to serve as a water oxygen barrier layer. The second inorganic layer 5 is covering the thin film transistor layer 2, and material of the second inorganic layer 5 may include a silicide, a metal oxide or the like.

Material of the hydrophobic film layer 7 includes: silicide or metal oxide, but is not limited thereto. A surface of the hydrophobic film layer 7 has an uneven shape such that the hydrophobic film layer 7 has a nanoscale microstructure, whereby the surface of the hydrophobic film layer 7 forms a layer of a nanoscale extremely thin air layer. When an external liquid (for example, moisture) contacts the hydrophobic film layer 7, since the air layer is interposed, direct contact of the moisture with the hydrophobic film layer 7 can be reduced, thereby improving the water-oxygen barrier ability of the hydrophobic film layer 7. In addition, the hydrophobic film layer 7 may also have a hydrophobic group, so that the contact angle of a surface of the hydrophobic film layer 7 with the external liquid is greater than 150 degrees, thereby further improving the water-oxygen barrier property of the hydrophobic film layer 7.

Figure 2:
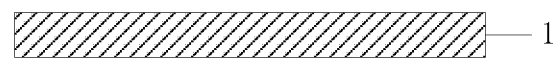
FIG. 2 is a schematic structural diagram of a base substrate according to an embodiment of the present disclosure.
Figure 7:
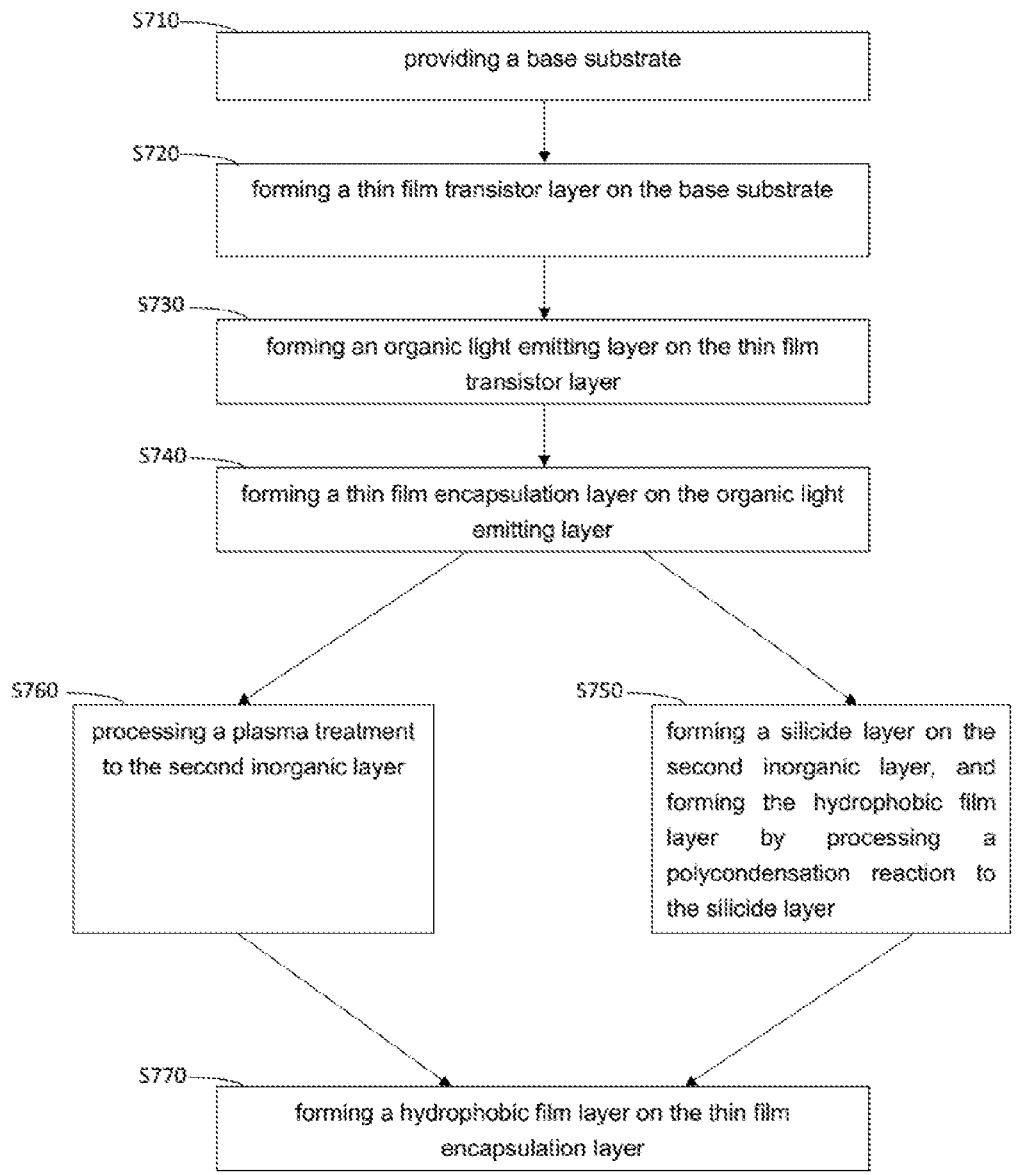
FIG. 7 is a flowchart of a method for manufacturing a display panel according to an embodiment of the present disclosure.

As shown in FIG. 7, FIG. 7 is a flowchart of a method for manufacturing a display panel according to an embodiment of the present disclosure, where the method includes the following steps:

Referring to FIG. 2, step S710: providing a base substrate 1.

In an embodiment of the present disclosure, the base substrate 1 may be a glass substrate, but is not limited thereto. For example, the base substrate 1 may also be a plastic substrate, or a base substrate made of a PI material.

Figure 3:
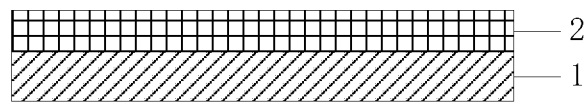
FIG. 3 is a flowchart of a process for manufacturing a thin film transistor layer according to an embodiment of the present disclosure.

Referring to FIG. 3, step S720: forming a thin film transistor layer 2 on the base substrate 1.

Figure 4:
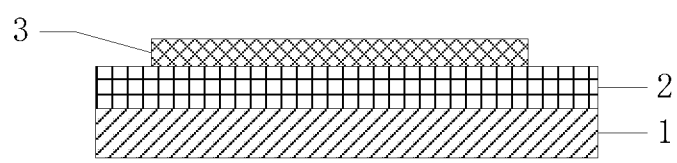
FIG. 4 is a flowchart of a process for manufacturing an organic light emitting layer according to an embodiment of the present disclosure.

Referring to FIG. 4, step S730: forming an organic light emitting layer 3 on the thin film transistor layer 2.

Figure 5:
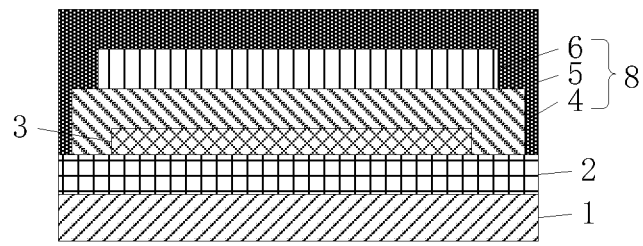
FIG. 5 is a flowchart of a process for manufacturing a thin film encapsulation layer according to an embodiment of the present disclosure.

Referring to FIG. 5, step S740: forming a thin film encapsulation layer 8 on the organic light emitting layer 3.

Figure 8:
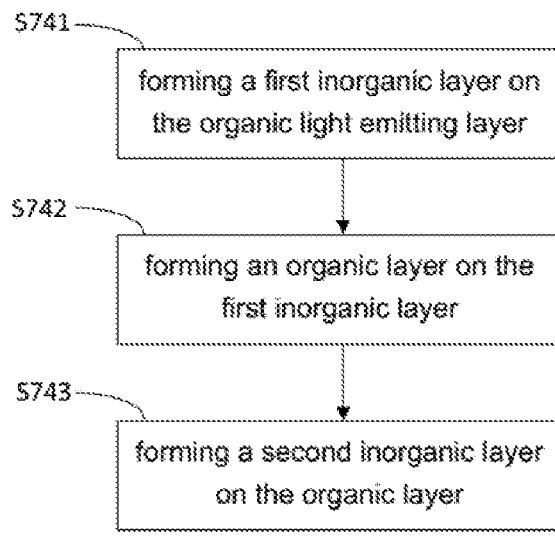
FIG. 8 is a flowchart of a method for manufacturing a thin film encapsulation layer according to an embodiment of the present disclosure.

As shown in FIG. 8, the step of forming a thin film encapsulation layer 8 on the organic light emitting layer 3 further including:

Step S741: forming a first inorganic layer 4 on the organic light emitting layer 3.

The first inorganic layer 4 serves as a water oxygen barrier layer, and material of the first inorganic layer 4 may include silicide, metal oxide, or the like.

Step S742: forming an organic layer 6 on the first inorganic layer 4.

The organic layer 6 is used for the sustained the production during the processing of the first inorganic layer 4. The organic layer 6 covers the foreign matter generated during the film formation of the inorganic layer, and prolongs the water-oxygen transmission channel.

Step S743: forming a second inorganic layer 5 on the organic layer 6.

The second inorganic layer 5 serves as a water oxygen barrier layer.

Material of the second inorganic layer 5 may include a silicide, a metal oxide, or the like.

Figure 6:
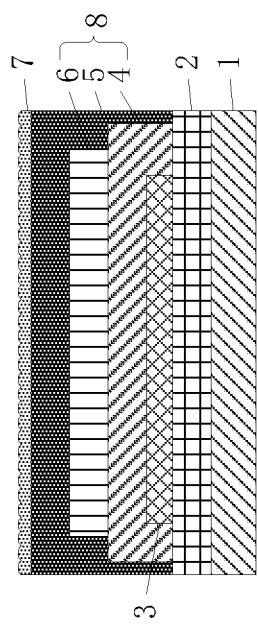
FIG. 6 is a flowchart of a process for manufacturing a hydrophobic film layer according to an embodiment of the present disclosure.

With continued reference to FIG. 7, and in conjunction with FIG. 6,

Step S770: forming a hydrophobic film layer 7 on the thin film encapsulation layer 8.

In step S770, the hydrophobic film layer 7 is formed on the thin film encapsulation layer 8, which may be formed by a different manner of step S750 or step S760.

Figure 9:
FIG. 9 is a flowchart of a method for manufacturing a first embodiment of the hydrophobic film layer of FIG. 6.

Referring to FIG. 9, step S750: forming a silicide layer on the second inorganic layer, and forming the hydrophobic film layer by processing a polycondensation reaction to the silicide layer.

In this embodiment, material of the silicide layer includes siloxane, and the siloxane monomer is processed to a polycondensation reaction to form a porous polymer, thereby constructing a hydrophobic film layer on the thin film encapsulation layer. The hydrophobic film layer has an uneven shape and having hydrophobic properties.

Figure 10:
FIG. 10 is a flowchart of a method for manufacturing a second embodiment of the hydrophobic film layer of FIG. 6.
Figure 11:
FIG. 11 is a flowchart of a method for manufacturing a second embodiment of the hydrophobic film layer of FIG. 6.

Referring to FIG. 10 and FIG. 11, step S760: processing a plasma treatment to the second inorganic layer 5.

Surface of the second inorganic layer 5 is processed to a plasma treatment to be an uneven shape, wherein material of the plasma treatment is an argon plasma or a nitrogen plasma. Since the surface treatment of the second inorganic layer 5 is processing through a non-oxygenated plasma having hydrophobic properties, after processing the plasma treatment, causing the surface of the second inorganic layer to become rough and hydrophobic, thereby forming a hydrophobic film layer 7.

By the steps S750 and S760, the surface of the hydrophobic film layer 7 has a concave shape, so that the hydrophobic film layer 7 has a nano-scale microstructure, and the structure makes the surface of the hydrophobic film layer 7 forming a nanometer-scale ultra-thin air layer. When the external moisture contacts the hydrophobic film layer 7, since the air layer is interposed, the direct contact of the moisture with the hydrophobic film layer 7 can be reduced, thereby improving the water-oxygen barrier ability of the hydrophobic film layer 7. In addition, the hydrophobic film layer 7 also has a hydrophobic group such that the contact angle of the surface of the hydrophobic film layer 7 with the external liquid is greater than 150 degrees, thereby further enhancing the water-oxygen barrier ability of the hydrophobic film layer 7.

Figure 12:
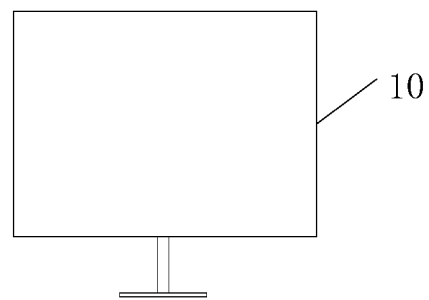
FIG. 12 is a schematic structural diagram of a display device according to an embodiment of the present disclosure.

As shown in FIG. 12, an embodiment of the present disclosure further provides a display device 10, which includes the above-described organic light emitting diode display panel. The specific structure of the OLED display panel will not be described herein.

The display device 10 can be any product or component having a display function, such as a mobile phone, a tablet computer, a television, a display, a notebook computer, a digital photo frame, a navigation device, or the like.

An advantage of the present disclosure: forming a film layer having super-hydrophobic properties of the outer water oxygen barrier layer of the thin film encapsulation layer. Further, a surface of the thin film encapsulation layer has an uneven shape, the hydrophobic film layer has a nano-scale microstructure. A surface of the hydrophobic film layer is formed into a nanometer-scale ultra-thin air layer. When the external moisture contacts the hydrophobic film layer, the direct contact between the water and the hydrophobic film layer can be reduced due to the air layer interposed therebetween, thereby improving the water and oxygen barrier ability of the hydrophobic membrane layer. In addition, the hydrophobic film layer further has a hydrophobic group, so that the contact angle of a surface of the hydrophobic film layer 7 with the external liquid is greater than 150 degrees, thereby further improving the water-oxygen barrier property of the hydrophobic film layer, reducing the penetration of water and oxygen effectively, improving the water-blocking ability of the film encapsulation layer, and extending the lifetime of the display panel.

In the above, the present disclosure has been disclosed in the above preferred embodiments, but the preferred embodiments are not intended to limit the present disclosure, person skilled in the art can make various modifications and refinements without departing from the spirit and scope of the present disclosure, and the scope of the present disclosure is defined by the scope of the claims.

What is claimed is:

1. A method of manufacturing an organic light emitting diode display panel, comprising:
   providing a base substrate;
   forming a thin film transistor layer on the base substrate;
   forming an organic light emitting layer on the thin film transistor layer;
   forming a thin film encapsulation layer on the organic light emitting layer comprising:
   forming a first inorganic layer on the organic light emitting layer;
   forming an organic layer on the first inorganic layer; and
   forming a second inorganic layer on the organic layer; and
   forming a hydrophobic film layer on the thin film encapsulation layer by forming a silicide layer on the second inorganic layer and processing a polycondensation reaction to the silicide layer.

2. The method of manufacturing the organic light emitting diode display panel as claimed in claim 1, wherein the hydrophobic film layer has a nano-scale microstructure.

3. The method of manufacturing the organic light emitting diode display panel as claimed in claim 1, wherein a surface of the hydrophobic film layer has a concave shape.

4. The method of manufacturing the organic light emitting diode display panel as claimed in claim 1, wherein a material of the silicide layer comprises a siloxane.

5. The method of manufacturing the organic light emitting diode display panel as claimed in claim 1, wherein a contact angle of a surface of the hydrophobic film layer with an external liquid is greater than 150 degrees.

* * * * *